United States Patent [19]

Ovshinsky et al.

[11] Patent Number: 4,843,443
[45] Date of Patent: Jun. 27, 1989

[54] THIN FILM FIELD EFFECT TRANSISTOR AND METHOD OF MAKING SAME

[75] Inventors: Stanford R. Ovshinsky, Bloomfield Hills; Stephen J. Hudgens, Southfield, both of Mich.

[73] Assignee: Energy Conversion Devices, Inc., Troy, Mich.

[21] Appl. No.: 210,255

[22] Filed: Aug. 19, 1988

Related U.S. Application Data

[63] Continuation of Ser. No. 23,344, Mar. 9, 1987, Pat. No. 4,769,338.

[51] Int. Cl.⁴ .............................................. H01L 27/82
[52] U.S. Cl. ...................... 357/23.7; 357/2; 357/4; 357/16
[58] Field of Search ..................... 357/23.7, 4, 2, 16

[56] References Cited

U.S. PATENT DOCUMENTS 4,470,060  9/1984  Yamazaki ..................... 357/23.4
4,668,968  5/1987  Ovshinsky ................... 357/23.7

*Primary Examiner*—Martin H. Edlow
*Attorney, Agent, or Firm*—Marvin S. Siskind; Richard M. Goldman

[57] ABSTRACT

There is disclosed a film field effect transistor which can be operated at fast switching rates for use, for example, in video display applications. The transistor includes a body of silicon semiconductor material having a structure more ordered than amorphous material and less ordered than single crystalline material. The source and drain of the transistor comprises rectifying contacts formed on the body of silicon semiconductor material. Also disclosed are a method of making the transistor and an electronically addressable array system utilizing the transistor to advantage.

20 Claims, 1 Drawing Sheet

THIN FILM FIELD EFFECT TRANSISTOR AND METHOD OF MAKING SAME

This application is a continuation of application Ser. No. 023,344 filed on Mar. 9, 1987 now U.S. Pat. No. 4,76,9,338.

FIELD OF THE INVENTION

The present invention generally relates to thin film field effect transistors and a method of making the transistors. The invention more particularly relates to thin film field effect transistors which are capable of operating at high switching speeds for applications where high speed operation is essential. Such applications include matrix array addressing systems wherein the addressing circuits are required to operate at video rates.

BACKGROUND

Electronic matrix arrays find considerable application in systems such as, for example, liquid crystal displays and high density memories. Such systems generally include X and Y address lines which are vertically spaced apart and cross at an angle to form a plurality of crossover points. Associated with each crossover point is an element to be selectively addressed. The elements can be, for example, the liquid crystal display pixels of a liquid crystal display or the memory cells of an electronically addressable memory array.

Some form of isolation device is generally associated with each array element. The isolation elements permit the individual elements to be selectively addressed by the application of suitable read potentials between respective pairs of the X and Y address lines.

Amorphous semiconductor thin film field effect transistors have found wide usage for the isolation devices in such arrays. Thin film field effect transistors formed from deposited semiconductors, such as amorphous silicon alloys are ideally suited for such applications because they exhibit a very high dark resistivity and therefore have very low reverse leakage currents. The reverse leakage currents are so low that very high on to off current ratios are made possible for effectivelym isolating the non-addressed array elements from the array elements being addressed.

While thin film field effect transistors formed from amorphous semiconductor alloys are ideally suited as isolation devices in addressable arrays, they are not so ideally suited for use in forming the addressing circuitry required for the selective addressing of the array elements. One reason for this is that these devices have not exhibited the switching speeds required for these applications.

For many applications, the components forming the addressing circuitry of electornically addressable arrays are required to switch at video rates, on the order of 50 megahertz, for example. Such is the case particularly in liquid crystal displays or fast read-out memories. Structurally, thin film field effect transistors generally include source and drain electrodes, a semiconductor material between the source and drain electrodes, and a gate electrode in proximity to the semiconductor but electrically insulated therefrom by a gate insulator. Current flow through the transistor between the source and drain is controlled by the application of a voltage to the gate electrode. The voltage on the gate electrode produces an electric field which accumulates a charged region near the semiconductor-gate insulator interface. This charged region forms a current conducting channel in the semiconductor through which the device current is conducted.

In thin film field effect transistors, bot output current and operating speed are directly related to the structural configurations of the devices and to the field effect mobility of the semiconductor material. The output current is directly proportional to the field effect mobility and is almost always inversely proportional to the current conduction channel length. The maximum operating frequency of such a device is related to the channel length which is fixed by the spacing between the source and drain electrodes in a more complicated manner. The reason for this is that the operating frequency is not only related to the channel length, but is also dependent upon the total capacitance of the device. The total capacitance has basically two components, a fixed capacitance due to electrode overlap, and a dynamic capacitance that results when the current conduction channel is formed. The fixed capacitance is a direct function of the electrode overlap. The dynamic capacitance however is inversely proportional to the channel length. Since both the output current and the dynamic capacitance are both inversely proportional to the channel length, the maximum operating frequency should be inversely proportional to the square of the channel length if the fixed capacitance is disregarded. Unfortunately, the fixed capacitance cannot be disregarded. As a result, as long as there remains some fixed capacitance, the total expected improvement in device speed with reduced channel length cannot be realized. For this reason, even though a thin film field effect transistor may have a narrow channel, the frequency response of the device can still be limited by the fixed capacitance and the field effect movility. The fixed capacitance can be the result of device design or process constraints imposed by limited photolithographic resolution. The field effect mobility is generally fixed by the type of semiconductor used to form the device and is generally low for amorphous semiconductor alloy devices.

Thin film field effect transistors have been made by processes including conventional 10 micron photolithography. Such conventional processes have resulted in minimum channel lengths on the order of the conventional feature size of 10 microns. Such channel lengths with the field effect mobilities of amorphous semiconductor alloys have resulted in relatively slow speed devices. One way to overcome the limitations inherent in conventional photolithographic resolution is to utilize a vertical structure where the current conduction channel length is determined by the vertical separation of the source and drain electrodes, as described and claimed in commonly assigned copending U.S. Application Ser. No. 529,299 for Thin Film Transistor, filed in the names of Richard A. Flasck, et al. The transistor therein disclosed includes source and drain regions vertically displaced with respect to each other relative to a substrate and having a deposited semiconductor therebetween. The length of the current conduction channel is a function of the vertical displacement distance between the source and drain electrodes and is substantially independent of the contraints otherwise imposed by standard 10 micron photolithography.

The aforementioned U.S. Application Ser. No. 529,299 of Richard A. Flasck, et al., for Film Transistor is a continuation of U.S. Application Ser. No. 280,378, filed Nov. 19, 1980, for Thin Film Transistor, which in turn was a continuation of Application Ser. No. 103,011, filed Dec. 13, 1979, for Deposited Film Memory Systems.

Further improvements in vertically arrayed thin film field effect transistor structures are described in the commonly assigned copending U.S. Application Ser. No. 549,996 of Hellmut Fritsche, et al., filed Nov. 8, 1983 for High performance, High Voltage, Small Area Thin Film Transistor and Method of Making Same. The vertical thin film field effect transistor therin disclosed includes source and drain electrodes vertically displaced with respect to each other and relative to a substrate, with an insulating layer therebetween. A semiconductor extends along the non-coplanar or diagonal edges of the source and drain electrodes and the insulating layer.

Further, improvements in vertically arrayed thin film field effect transistor structures are described in the commonly assigned copending U.S. Application Ser. No. 550,234 of Zvi Yaniv, et al., filed on Nov. 8, 1983, for High Performance Thin Film Transistor Having Improved Carrier Injection. The transistor therein disclosed includes source and drain electrodes vertically displaced with respect to each other relative to a substrate, with a deposited semiconductor extending along the non-coplanar or diagonal edges of the source and drain electrodes, wherein the contacts between the semiconductor and the source and drain electrodes include an ohmic contact enhancement means incorporated therein. Further improvements in vertical thin film field effect transistor structures are described in the commonly assigned copending U.S. Application Ser. No. 549,979 of Gregory Hansell, et al., filed on Nov. 8, 1983 for Thin Film Transistor Having Annealed Gate Oxide and Method of Making Same. The transistors therein disclosed have an annealed insulator layer between the gate electrode and the semiconductor.

Common to all of the above described field effect transistors is a vertical structure, that is, a structure where the drain is vertically displaced from the source. All of these transistor structures provide a current conduction channel length of one micron or less while still allowing the use of conventional photolithography during the fabrication of the devices. A horizontal thin film field effect transistor having a short current conduction channel in a deposited semiconductor between closely spaced source and drain electrodes is fully described in copending and commonly assigned U.S. Application Ser. No. 557,773, filed on Dec. 5, 1983 in the names of Mohshi Yang and David Vesey, for Short Channel Thin Film Field Effect Transistor. This transistor has a generally horizontal structure. The source and drain electrodes are in contact with a semiconductor, and separated from each other by a dimension less than the feature size of conventional photolithographic processsess.

As described therein, the source and drain electrodes are formed by forming a thick film of photoresist over a first electrode material, exposing the photoresist through a photomask, developing the photoresist, etching the underlying electrode material to undercut the photoresist to form one electrode, and thereafter, without removal of the remaining photoresist, shadow depositing the other electrode. The shadow deposition is carried out from a unidirectional or collimated source. As a result, deposition is avoided within the shadow of the photoresist which can be on the order of one micron or less in dimension to form the closely spaced source and drain electrodes.

While the transistor and process described immediately above provide significant improvements to planar or generally horizontal thin film field effect transistors, there remains some overlap of the drain and source electrodes with the gate electrode. It has been determined that even though these devices are capable of operating at speeds not heretofore possible for planar thin film field effect transistors, the fixed capacitance of the devices limits the operating speeds thereof to a point where all of the advantages of the short current conduction channel lengths cannot be fully obtained.

A further improvement in thin film field effect structures is disclosed in commonly assigned copending U.S. Application Ser. No. 590,836, of Zvi Yaniv et al., filed Mar. 19, 1984, for Improved Reduced Capacitance Narrow Channel Thin Film Transistor And Method Of Making Same. The transistor structure there disclosed provides a thin film field effect transistor having substantially reduced capacitance as a result of having virtually no drain and source electrode overlap with the gate electrode while having a narrow current conduction channel. The transistor includes an insulative substrate, a gate electrode formed on the substrate, wherein the gate electrode has a minor dimension of about one micron or less. The transistor further includes a gate insulator overlaying the gate electrode, and source and drain electrodes disposed over the gate insulator in nonoverlapping relation to the gate and being spaced apart by a distance substantially equal to the gate minor dimension. A layer of semiconductor material is disposed between the source and drain electrodes in electrical connection therewith.

Each of the foregoing transistor structures disclosed in the above-referenced applications, which are assigened to the assignee of the present invention, represents a significant improvement in the amorphous semiconductor alloy thin film field effect transistor art. However, as previously mentioned, the switching speeds of these devices are not only dependent upon device configuration, but also are directly dependent upon the field effect mobility of the semiconductor through which the device current must pass. Unfortunately, amorphous semiconductor alloys exhibit relatively low field effect mobilities on the order of 0.1 to 1. Hence, even though improved device configurations have been made possible as described above, the field effect mobilities of these devices essentially preclude their use in applications such as in addressing circuitry, where video rate switching is often required.

In summary, while amorphous semiconductor alloy thin film field effect transistors are ideally suited for many applications, such as for isolating matrix array elements to be selectively addressed, they are not suited for use in applications where video rate switching is required in association with other components which would be adversely affected by the processing of the devices. For this particular and important application, a new improved thin film field effect transistor is required. The improved transistor must include a semiconductor material having high field effect mobility. It preferably should be adapted to be fabricated using commercially acceptable processes and conventional 10 micron photolithography permitting large area application while still exhibiting fast swithcing rates at, for example, video rates of about 50 Mhz.

Thin film transistors have been made with polycrystalline silicon and reported in the literature. See for example, "Thin-film transistors on molecular-beam-deposited polycrystalline silicon", Matsui et. al., 55 J. Applied Physics 1590, Mar. 15, 1984. Matsui disclosed a thin film transistor with source and drain regions formed in polycrystalline silicon by ion implantation which is generally not a commercially acceptable process.

SUMMARY OF THE INVENTION

The invention provides a thin film field effect transistor capable of operating at video switching rates. The transistor comprises a body of semiconductor material including silicon. The semiconductor material has a structure more ordered than amorphous semiconductor material and less ordered than single crystalline semiconductor material. The transistor further includes source and drain elements forming rectifying contacts with the body of semiconductor material and a gate electrode adjacent to and insulated from the body semiconductor material.

The source and drain are formed on the body of silicon semiconductor material. The source and drain elements can be deposits of a doped body semiconductor on the body of semiconductor material.

The doped deposits for the source and drain are preferably n-type when the body of semiconductor material is slightly p-type and p-type when the body semiconductor material is slightly n-type.

Alternately, source and drain electrodes can be formed as deposits of metal on the body of semiconductor material.

The body of semiconductor material can further include compensating elements such as hydrogen of fluorine. The body of semiconductor material can also be an alloy of silicon and germanium.

The invention further provides a system for selectively addressing each element of an array of elements. The system includes a first set of address lines, and a second set of address lines spaced from and crossing at an angle to the first set of address lines to form a plurality of crossover points therewith wherein each crossover point is associated with a given one of the elements to be addressed. The system further includes addressing circuitry coupled to the first and second sets of address lines for selectively applying addressing potentials to respective pairs of the first and second sets of address lines. The addressing circuitry includes at least one thin film field effect transistor comprising a body of semiconductor material including silicon or an alloy of silicon and germanium, for example. The semiconductor material has a structure more ordered than amorphous semiconductor material and less ordered than single crystalline semiconductor material.

The invention further provides a method of making a thin film field effect transistor. The method includes the steps of forming a body of semiconductor material including silicon wherein the silicon semiconductor material is formed with a structure more ordered than amorphous semiconductor material and less ordered than single crystalline semiconductor material, forming source and drain elements in rectifying contact with the body of semiconductor material, and forming a gate electrode adjacent to and insulated from the body of semiconductor material.

The method can also include the step of forming a body of semiconductor alloy material including a combination of silicon and germanium.

The body of semiconductor material is preferably formed by depositing the semiconductor material onto a substrate which is heated to a temperature between 450° and 500° C. The body of semiconductor material is preferably deposited by molecular beam epitaxy.

The semiconductor body can be annealed prior to forming the drain and source elements in a hydrogen gas atmosphere, in an atmosphere of hydrogen gas and a forming gas, in a hydrogen plasma, or in a fluorine plasma. The semiconductor body can be annealed at a temperature of about 500° C. and at a pressure between 0.1 and 0.5 Torr.

DESCRIPTION OF THE PREFERRED EMBODIMENTS

Figure 1:
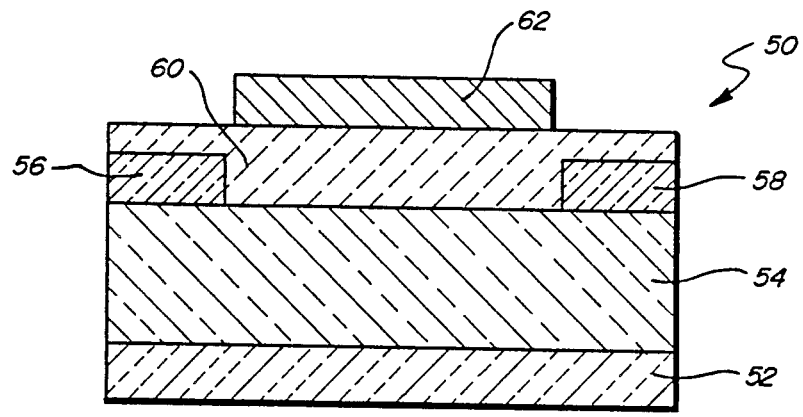
FIG. 1 is a cross-sectional side view of a thin film field effect transistor embodying the present invention.

A thin film field effect transistor 50 structured in accordance with the present invention is illustrated in FIG. 1. The transistor 50 includes a substrate 52 which can be formed from an insulating material, such as glass, for example. Formed on the substrate 52 is a body 54 of semiconductor material. The body 54 of semiconductor material includes at least silicon or an alloy of silicon and other elements such as germanium. The body of semiconductor material 54 is formed with a structure which is more ordered than amorphous semiconductor material and less ordered than single crystalline semiconductor material. Such material can include, for example, microcrystalline or polycrystalline semiconductor material. By the term "amorphous" is meant an alloy or material which has lone-range disorder, although it may have short or intermediate order or even contain at times some crystalline inclusions.

The body of semiconductor material 54 can be formed to have such structure by depositing the silicon or silicon and germanium semiconductor material by an MBE (molecular beam epitaxy) deposition of the type well known in the are. The deposition is preferably achieved using a target of powdered polycrystalline silicon or silicon and germanium. The substrate 52 is preferably heated to a temperature between 450° C. and 500° C. and the deposition pressure is preferably maintained at 10-8 Torr or less. Under these deposition conditions, the deposited body of semiconductor material 54 will have indeed a more ordered structure than amorphous material and a less ordered structure than single crystalline material. More specifically, the silicon or silicon and germanium alloy semiconductor material thus deposited will have a grain size ranging from 2,000Å to 3,000Å.

When the target of powdered polycrystalline silicon or silicon and germanium is intrinsic or not intentionally doped, the resulting body of deposited silicon or silicon and germanium material is slightly p-type (n-type). If the target of polycrystalline silicon or silicon and germanium has been doped to be lightly n-type, the resulting body of deposited silicon or silicon and germanium material is slightly n-type.

After the body of semiconductor material 54 is formed, it can be postcompensated by annealing in an atmosphere of hydrogen, an atmosphere of hydrogen and a forming gas such as nitrogen, in a hydrogen plasma, or in a fluorine plasma. The annealing process is preferably accomplished at a temperature of about 500° C. and a pressure between 0.1 to 0.5 Torr.

By annealing the body 54 of semicondictor material as described above, the compensating elements such as hydrogen or fluoring are diffused into the body 54 of semiconductor material to compensate for dangling bonds or other structural defects which may exist in the material. The material after annealing can thus be considered a silicon or a silicon and germanium semiconductor alloy incorporating either hydrogen or fluorine. The annealing in a hydrogen and nitrogen atmosphere is preferred inasmuch as the nitrogen serves as a forming gas to reduce defects at the grain boundaries of the material.

The transistor 50 further includes a source 56 and a drain 58. In accordance with this preferred embodiment of the present invention, the source and drain 56 and 58, respectively, take the form of deposits of doped semiconductor material. Preferably, the doped semiconductor material comprises an amorphous silicon alloy containing hydrogen and/or fluorine. The doped semiconductor forming the source and drain 56 and 58 is preferably doped n-type with phosphorus. This amorphous semiconductor alloy is preferably deposited in a manner as fully described in the aforementioned U.S. Pat. No. 4,226,898. Preferably, the doped semiconductor material forming the source and drain 56 and 58 includes fluorine. Such material has been found to be a superior n-type material in that it has very high electrial conductivity and exhibits substitutional doping characteristics. With the body 54 of semiconductor material being p-type and the source 56 and drain 58 being formed from n-type amorphous silicon alloy material, the source and drain 56 and 58 will form rectifying contacts with the body 54 of semiconductor material to reduce the reverse leakage current conducted through the device.

If the body of the semiconductor material is slightly n-type, the source 56 and drain 58 can be formed of p-type amorphous silicon alloy material so as to form the rectifying contacts. In this case boron is used as the dopant.

The use of a source and a drain formed of amorphous silicon alloys as disclosed above deposited onto a body such as 54 results in a number of advantages. Depositing an amorphous semiconductor alloy onto the body 54 to form the source 56 and the drain 58 is faster than processes where the source and drain are implanted into the body. Further, deposition of amorphous alloys to form source and drain regions can readily be carried out with respect to many transistors to be formed over a wide area. The amorphous silicon can also be tailored to have differing characteristics for various applications.

Formed over the source 56, drain 58, and the body 54 of silicon or silicon and germanium semiconductor alloy material is a gate insulator 60. The gate insulator 60 can be formed from silicon oxide or silicon nitride. The gate insulator 60 can be deposited by a glow discharge process as disclosed, for example, in U.S. Pat. No. 4,226,898 which issued on Oct. 7, 1980 in the names of Stanford R. Ovshinsky and Arun Madan for Amorphous Semiconductors Equivalent To Crystalline Semiconductors.

When the gate insulator 60 is formed from a silicon oxide, it can be deposited by the glow discharge decomposition of, for example, silane ($SiH_4$) and oxygen. When the gate insulator is formed from silicon nitride, it can be deposited from the glow discharge decomposition of silane and ammonia ($NH_3$).

The device 50 is completed with the formation of a gate electrode 62 over the gate insulator 60. The gate electrode 62 can be formed from any conductive metal such as aluminum or chromium.

As an alternate to the use of an amorphous silicon alloy film to form the source 56 and drain 58, when the body 54 is n-type, the source and drain can be formed of deposits of a high work function metal such as platinum or palladium. If the source 56 and drain 58 are formed of a high work function metal they will form rectifying contacts with the body 54 of silicon semiconductor material and serve the same function as do the rectifying contacts formed when the amorphous semiconductor alloy film is used to form the source and drain regions. When the body 54 is p-type, the source 56 and drain 58 can be formed of low woek function metals such as magnesium or ytterbium. These metals can be deposited by evaporation.

With respect the embodiment of FIG. 1, the body 54 of semiconductor material is preferably deposited to a thickness of 2000Å to 1 micron. The source 56 and drain 58 are preferably formed to have thicknesses on the order of 100 to 500Å when formed from a p-type or an n-type region or 100 to 1000Å when formed from a high or low work function metal. The gate insulator 60 is preferably formed to have a thickness ranging between 300 to 5000Å for disposing the gate electrode 62 adjacent the body 54 of semiconductor material and electrically insulated therefrom.

When it is desired to cause the thin film field effect transistor 50 to conduct, assuming it has a slightly p-type body 54, a positive potential is applied to both the gate 62 and the source 56 of the device. The positive gate potential will cause a carrier inversion to take place within the body 54 of the semiconductor material so that electron accumulation takes place at the interface between the gate insulator 60 and the body 54 of semiconductor material. This charge accumulation forms the current conducting channel within the device for conducting the device current between the source 56 and drain 58.

When it is desired to terminate conduction within the device, the positive gate potential is removed to cause the accumulated charge at the interface of the gate oxide 60 and the body 54 of semiconductor material to be depleted. When this occurs, the current will cease flowing between the source 56 and drain 58. Because the source and drain form rectifying contacts with the body 54 of semiconductor material, they will preclude carrier injection in the reverse direction to thereby minimize the reverse leakage current of the device 50.

Figure 2:
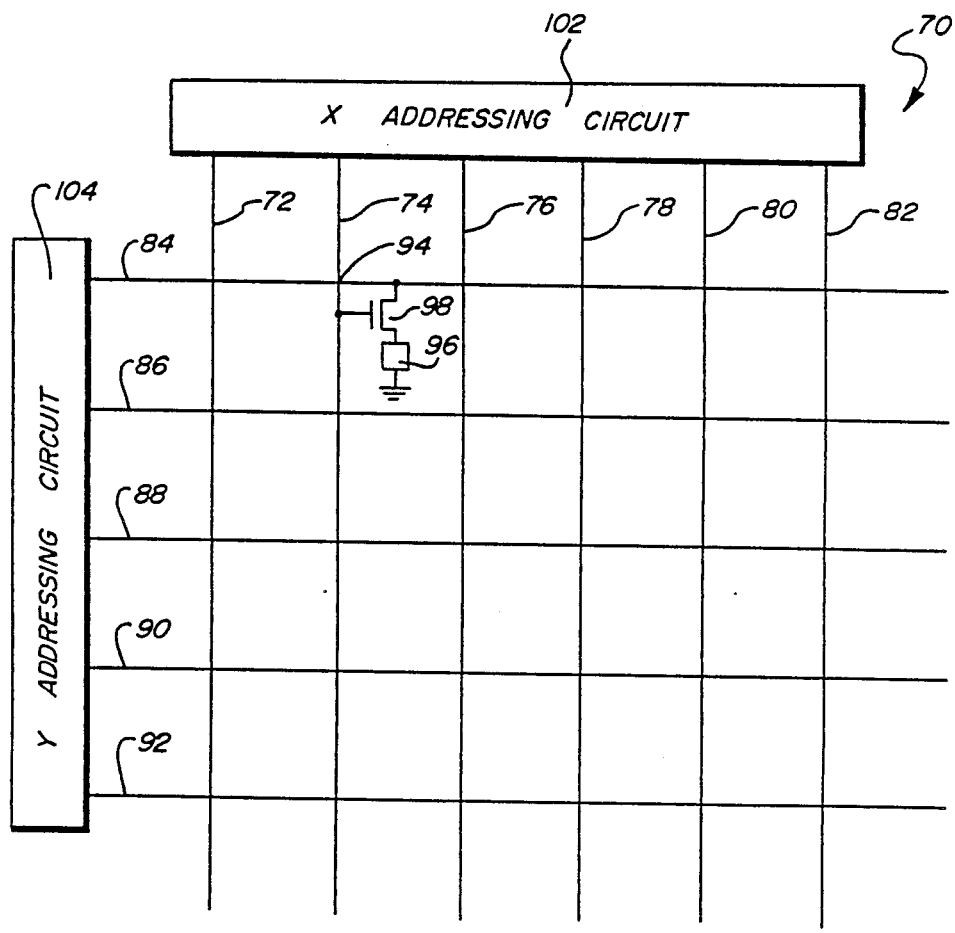
FIG. 2 is a schematic diagram, partially in block form, of an electronically addressable matrix array of the type which can utilize the thin film field effect transistor of the present invention to advantage.

FIG. 2, illustrates a system 70 which can utilize the thin film field effect transistor 50 of the present invention to advantage. The system 70 is of the type which includes a plurality of X address lines 72, 74, 76, 78, 80, and 82 and a plurality of Y address lines 84, 86, 88, 90, and 92. The X and Y address lines are vertically spaced with respect to each other and cross at an angle to form a plurality of crossover points such as crossover point 94 formed by X address line 74 and Y address line 84.

Associated with each crossover point is an array element, such as element 96 associated with crossover point 94. Also associated with each crossover point is an isolation device such as a field effect transistor 98. As previously described, the isolation device, such as field effect transistor 98, serves to permit selective addressing of the array elements, such as element 96. The isolation device 98 essentially isolates the non-addressed elements from the elements being addressed. Also as previously described, the thin film field effect transistor isolating devices preferably take the form of amorphous silicon alloy thin film field effect transistors because such transistors exhibit an extremely low reverse leakage. As illustrated in FIG. 2, the gate of transistor 98 is coupled to the X address line 74. The source of transistor 98 is coupled to Y address line 84. The drain of transistor 98 is coupled to the element 96 to be addressed and the oposite side of the element 96 is coupled to a common potential, such as ground potential.

Associated with each of the X address lines 72 through 82 ia an X addressing circuit 102 and associated with each of the Y address lines 84 through 92 is a Y addressing circuit 104. Addressing circuits of this type can include the thin film field effect transistors of the present invention to distinct advantage. Circuits of this type utilizing field effect transistors are disclosed, for example, in an article entitled "A Liquid Crystal TV Display Panel With Drivers" which was published in SID Digest, Vol. 82, at pages 48 and 49. The X addressing circuit 102 and Y addressing circuit 104 provide read potentials between respective pairs of the X address lines and Y address lines so as to selectively address the elements of the array such as element 96. When the array is a liquid crystal display, the element 96 is a liquid crystal display pixel and when the array is a memory matrix, the element 96 can take the form of an individual memory cell.

From the foregoing, it can be appreciated that the present invention provides a thin film field effect transistor which provides high-speed operation, as for example, switching speeds at video rates. Therefore, the thin film field effect transisstor of the present invention is ideally suited for use in addressing circuitry for liquid crystal video displays of fast readout electronically addressable memory arrays. The thin film field effect transistor of the present invention can be formed by using conventional 10 micron photolithography. This renders the devices ideally suited for commercial and large area applications.

We claim:

1. A thin film field effect transistor comprising:
   a body of semiconductor material including at least silicon, said semiconductor material being formed with a structure more ordered than amorphous silicon semiconductor material and less ordered than single crystalline silicon semiconductor material;
   a source and a drain operatively disposed in rectifying contact with said body of semiconductor material; and
   a gate electrode operatively disposed adjacent to and insulated from said body of semiconductor material.

2. A transistor as defined in Claim 1 wherein the semiconductor material further includes hydrogen.

3. A transistor as defined in claim 2 wherein the semiconductor material further includes fluorine.

4. A transistor as defined in claim 1 wherein the source and drain include a doped semiconductor in at least two spaced apart regions on the body of semiconductor material.

5. A transistor as defined in claim 4 wherein the doped semiconductor comprises an amorphous semiconductor alloy.

6. A transistor as defined in claim 5 wherein the amorphous semiconductor alloy includes silicon.

7. A transistor as defined in claim 6 wherein the amorphous silicon alloy includes hydrogen.

8. A transistor as defined in claim 7 wherein the amorphous silicon alloy includes hydrogen.

9. A transistor as defined in claim 4 wherein the doped semiconductor is n-type.

10. A transistor as defined in claim 9 wherein the doped semiconductor includes phosphorus.

11. A transistor as defined in claim 1 further including forming an insulative layer operative disposed between the gate electrode and the body of semiconductor material.

12. A method as defined in claim 11 wherein the insulative layer is formed from silicon oxide or silicon nitride.

13. A transistor as defined in claim 1 wherein the semiconductor material is about 1 micron thick.

14. A transistor as defined in claim 1 wherein the gate electrode is formed from a metal.

15. A transistor as defined in claim 13 wherein the metal is chromium or aluminum.

16. A transistor as defined in claim 1 wherein the source and drain include a metal formed on at least two spaced apart regions and operatively disposed relative to the body of semiconductor material.

17. A transistor as defined in claim 16 wherein the body of semiconductor material is formed to be n-type and wherein the metal is a high work function metal.

18. A transistor as defined in claim 17 wherein the high work function metal is either platinum or palladium.

19. A transistor as defined in claim 16 wherein the body of semiconductor material is formed to be p-type and wherein the metal is a low work functional metal.

20. A transistor as defined in claim 19 wherein the low work function metal is magnesium or ytterbium.

* * * * *